United States Patent
Kwon et al.

(10) Patent No.: US 10,276,828 B2
(45) Date of Patent: Apr. 30, 2019

(54) ORGANIC LIGHT-EMITTING DISPLAY APPARATUS

(71) Applicant: LG Display Co., Ltd., Seoul (KR)

(72) Inventors: SunKap Kwon, Paju-si (KR); Namseok Yoo, Seoul (KR)

(73) Assignee: LG Display Co., Ltd., Seoul (KR)

( * ) Notice: Subject to any disclaimer, the term of this patent is extended or adjusted under 35 U.S.C. 154(b) by 251 days.

(21) Appl. No.: 15/337,875

(22) Filed: Oct. 28, 2016

(65) Prior Publication Data

US 2017/0155085 A1 Jun. 1, 2017

(30) Foreign Application Priority Data

Nov. 30, 2015 (KR) .................. 10-2015-0168579

(51) Int. Cl.
H01L 51/50 (2006.01)
H01L 51/52 (2006.01)

(52) U.S. Cl.
CPC ...... H01L 51/5253 (2013.01); H01L 51/5281 (2013.01); H01L 51/5284 (2013.01); H01L 51/5221 (2013.01)

(58) Field of Classification Search
None
See application file for complete search history.

(56) References Cited

U.S. PATENT DOCUMENTS

2003/0117071 A1* 6/2003 Lee .................... H01L 51/5221 313/512
2004/0245541 A1 12/2004 Shitagaki et al.
2006/0087223 A1 4/2006 Yasukawa et al.
2014/0048829 A1 2/2014 Shin et al.
2015/0076461 A1 3/2015 Shitagaki et al.
2016/0079554 A1 3/2016 Zhu et al.

FOREIGN PATENT DOCUMENTS

| CN | 1510972 A | 7/2004 |
|---|---|---|
| CN | 1732714 | 2/2006 |
| CN | 103811671 | 5/2014 |
| CN | 104201288 A | 12/2014 |
| JP | 2004241134 A | 8/2004 |

OTHER PUBLICATIONS

Office Action for Chinese Patent Application No. CN 201610982685.3, dated Jan. 23, 2018, 19 Pages.
The State Intellectual Property Office of the People's Republic of China, Second Office Action, CN Patent Application No. 201610982685.3, dated Oct. 9, 2018, 17 pages.

* cited by examiner

Primary Examiner — Gregory D Clark
(74) Attorney, Agent, or Firm — Fenwick & West LLP

(57) ABSTRACT

An organic light-emitting display (OLED) apparatus includes an organic light-emitting device including an anode, an organic light-emitting layer, and a cathode. The OLED apparatus also includes an encapsulation element covering the organic light-emitting device, and a particular layer disposed between the organic light-emitting device and the encapsulation element. The particular layer is doped with a light absorption material that absorbs light having a wavelength shorter than a wavelength of light emitted from the organic light-emitting device so that variation in characteristics of the organic light-emitting device by external light is reduced. Accordingly, the lifespan of the OLED apparatus can be improved.

11 Claims, 5 Drawing Sheets

ORGANIC LIGHT-EMITTING DISPLAY APPARATUS

CROSS-REFERENCE TO RELATED APPLICATIONS

This application claims the priority of Republic of Korea Patent Application No. 10-2015-0168579 filed on Nov. 30, 2015, in the Republic of Korea Intellectual Property Office, the disclosure of which is incorporated herein by reference in its entirety.

BACKGROUND

Technical Field

The present disclosure relates to an organic light-emitting display (OLED) apparatus.

Description of the Related Art

An organic light-emitting display (OLED) apparatus is a self-luminance display apparatus and is emerging as the next generation display device. Specifically, an OLED apparatus utilizes the phenomenon that holes injected from an anode and electrons injected from a cathode recombine in an emission layer to form excitons, and light of a particular wavelength is generated as energy is released when the excitons relax from an excited state to the ground state.

An OLED apparatus, unlike a liquid-crystal display (LCD) apparatus, does not require any additional light source and thus there is an advantage in that it can be made lighter and thinner. In addition, an OLED apparatus is advantageous over an LCD apparatus in terms of viewing angle, contrast ratio, response time, power consumption, etc., and thus is being developed as the next generation display apparatus.

SUMMARY

The present disclosure relates to an OLED apparatus that includes a particular layer containing a light absorption material between an organic light-emitting device and an encapsulation element to thereby suppress variation in characteristics of the organic light-emitting device due to external light.

An OLED apparatus is very vulnerable to moisture ($H_2O$) and/or oxygen ($O_2$). Specifically, if moisture or oxygen permeates into the two electrodes and an organic light-emitting device configured as an organic light-emitting layer disposed between the two electrodes, the electrodes may be oxidized or the organic material may deteriorate, such that a variety of defects such as a dark spot, pixel shrinkage and the like may occur, thereby shortening the lifespan. Pixel shrinkage refers to the defect that the interface between the electrodes and the organic light-emitting layer of a pixel is oxidized or deteriorates by permeation of moisture or oxygen, such that the edge of the pixel becomes dark. If the pixel shrinkage lasts for long hours, it may develop to a dark spot that the pixel becomes black entirely, thereby seriously affecting the reliability of the OLED apparatus.

To solve such problems, a shield cap made of metal or glass may be used to seal the side surfaces, or an adhesive layer may be applied on the front surface of the organic light-emitting device to seal the front surface. Alternatively, a filler and a dam surrounding the filler may be used to seal the side surfaces as well as the front surface, to protect the OLED apparatus from moisture or oxygen.

During a process of forming an encapsulation element of an OLED apparatus by using any of the above-described ways, a photo-curing process may be employed. For example, in fabricating an OLED apparatus by using a method of sealing the front surface, the front surface of an adhesive layer made of a curable resin may be attached to a lower substrate such that the adhesive layer seals an organic light-emitting device formed on the lower substrate, and then an encapsulation element may be cured and fixed via an irradiation process with ultraviolet rays or the like. Or, in fabricating an OLED apparatus by using a method of sealing the side surfaces and the front surface, the filler sealing the front surface of the organic light-emitting device or the dam surrounding the filler may also be cured and fixed via an irradiation process.

The present inventors recognized that there is a problem during the irradiation process in fabricating OLED apparatus in that the organic light-emitting device may be damaged. Specifically, when light such as ultraviolet ray is irradiated onto an OLED apparatus for fixing the encapsulation element, the organic material of the organic light-emitting device may be damaged by the ultraviolet rays, resulting in increase in the driving voltage and decrease in the lifespan of the OLED apparatus.

Further, in some applications or implementations, if an OLED apparatus is exposed to a particular external environment such as sun light for long hours (as for automobile or vehicle dashboard displays), the organic light-emitting device may be damaged. As a result, the lifespan of the OLED apparatus may be shortened.

In view of the above, an object of the present disclosure is to provide an OLED apparatus with improved driving voltage and lifespan by forming a particular layer containing a light absorption material on an organic light-emitting device to thereby reduce damage to the organic light-emitting device by irradiation during a processing step or by exposure to external environment such as sun light.

Another object of the present disclosure is to provide an OLED apparatus with improved reliability by doping a light absorption material into a particular layer that is disposed to be in contact with a cathode of an organic light-emitting device to thereby reduce damage to the organic light-emitting device by external light or damage to the cathode by moisture $H_2O$ or oxygen $O_2$.

It should be noted that objects of the present disclosure are not limited to the above-described objects, and other objects of the present disclosure will be apparent to those skilled in the art from the following descriptions.

According to an aspect of the present disclosure, there is provided an organic light-emitting diode (OLED) apparatus including an organic light-emitting device including an anode, an organic light-emitting layer, and a cathode. The OLED apparatus also includes an encapsulation element covering the organic light-emitting device, and a particular layer disposed between the organic light-emitting device and the encapsulation element. The particular layer comprises a light absorption material that absorbs light having a wavelength shorter than a wavelength of light emitted from the organic light-emitting device so that variation in characteristics of the organic light-emitting device by external light is reduced.

According to another aspect of the present disclosure, there is provided an organic light-emitting display (OLED) apparatus including, an organic light-emitting device disposed on a substrate and including an anode, an organic light-emitting layer, and a cathode. The OLED apparatus also includes a particular layer disposed on the organic light-emitting device to cover the cathode, wherein the particular layer contains a light absorption material.

According to an exemplary embodiment of the present disclosure, a particular layer containing a light absorption material is disposed between an organic light-emitting device and an encapsulation element, such that the organic light-emitting device can be protected from light irradiated during a process of curing the encapsulation element or from external light such as sun light. Accordingly, it is possible to improve the problem that the driving voltage of the OLED apparatus is increased and accordingly the lifespan of the OLED apparatus can be improved.

According to an exemplary embodiment of the present disclosure, a particular layer including a light absorption material comes in contact with a cathode of an organic light-emitting device, such that it is possible to suppress the cathode from being oxidized by moisture or oxygen while improving the problem that the organic light-emitting device is damaged by external light. Accordingly, the driving voltage and lifespan of the OLED apparatus can be improved.

According to an exemplary embodiment of the present disclosure, the light absorption material is contained in a particular layer outside the organic light-emitting device, such that it is possible to avoid the problem that the mobility of the charges of the organic light-emitting device becomes lowered, compared to the structure in which the light absorption material is doped into some organic layers inside the organic light-emitting device. As a result, it is possible to suppress degradation in characteristics of the organic light-emitting device by the light absorption material while reducing damage to the organic light-emitting device by the external light.

It should be noted that effects of the present disclosure are not limited to those described above and other effects of the present disclosure will be apparent to those skilled in the art from the following descriptions.

This summary is not to specify essential features of the appended claims, and thus the scope of the claims is not limited thereby.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE PREFERRED EMBODIMENT

Figure 1:
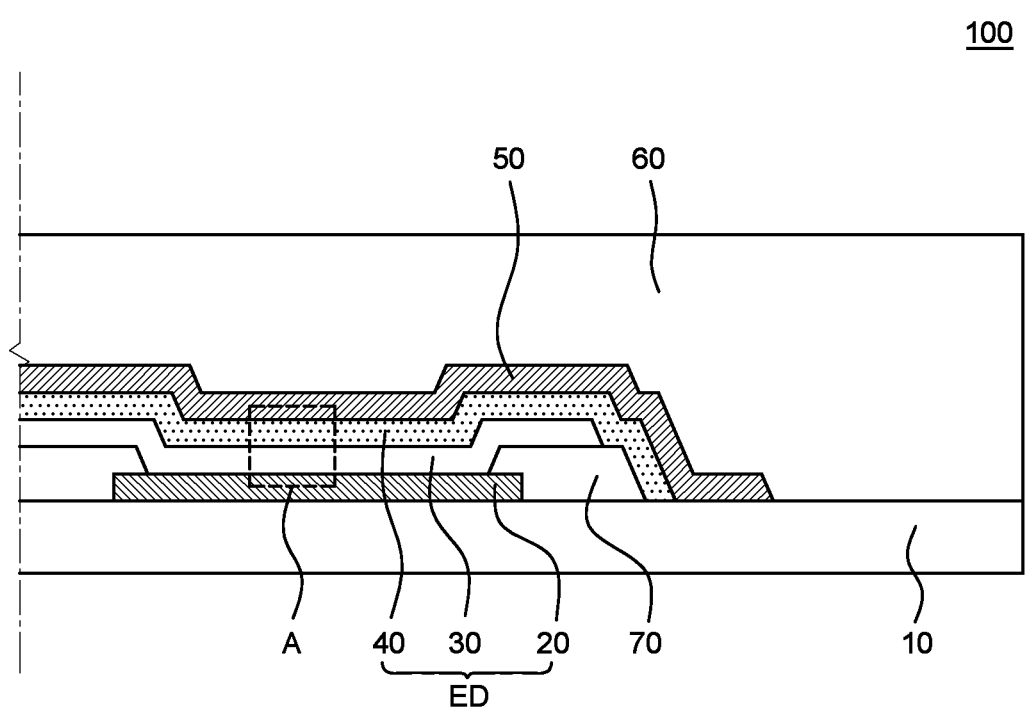
FIG. 1 is a cross-sectional view of an OLED apparatus according to an exemplary embodiment of the present disclosure.

Advantages and features of the present disclosure and methods to achieve them will become apparent from the descriptions of exemplary embodiments hereinbelow with reference to the accompanying drawings. However, the present invention is not limited to exemplary embodiments disclosed herein but may be implemented in various different ways. The exemplary embodiments are provided for making the disclosure of the present invention thorough and for fully conveying the scope of the present invention to those skilled in the art. It is to be noted that the scope of the present invention is defined by the claims.

The figures, dimensions, ratios, angles, the numbers of elements given in the drawings are merely illustrative and are not limiting. Like reference numerals denote like elements throughout the descriptions. Further, in describing the present disclosure, descriptions on well-known technologies may be omitted in order not to unnecessarily obscure the gist of the present disclosure.

It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g. "a," "an," "the," this includes a plural of that noun unless specifically stated otherwise.

In describing elements, they are interpreted as including error margins even without explicit statements.

In describing positional relationship, such as "an element A on an element B," "an element A above an element B," "an element A below an element B" and "an element A next to an element B," another element C may be disposed between the elements A and B unless the term "directly" or "immediately" is explicitly used.

In describing temporal relationship, terms such as "after," "subsequent to," "next to" and "before" are not limited to "directly after," "directly subsequent to," "immediately next to" "immediately before," and so on, unless otherwise specified.

The terms first, second, third and the like in the descriptions and in the claims are used for distinguishing between similar elements and not necessarily for describing a sequential or chronological order. Theses terms are used to merely distinguish one element from another. Accordingly, as used herein, a first element may be a second element within the technical idea of the present disclosure.

The drawings are not to scale and the relative dimensions of various elements in the drawings are depicted schematically and not necessarily to scale.

Features of various exemplary embodiments of the present disclosure may be combined partially or totally. As will be clearly appreciated by those skilled in the art, technically various interactions and operations are possible. Various exemplary embodiments can be practiced individually or in combination.

Hereinafter, exemplary embodiments of the present disclosure will be described in detail with reference to the accompanying drawings.

Figure 2:
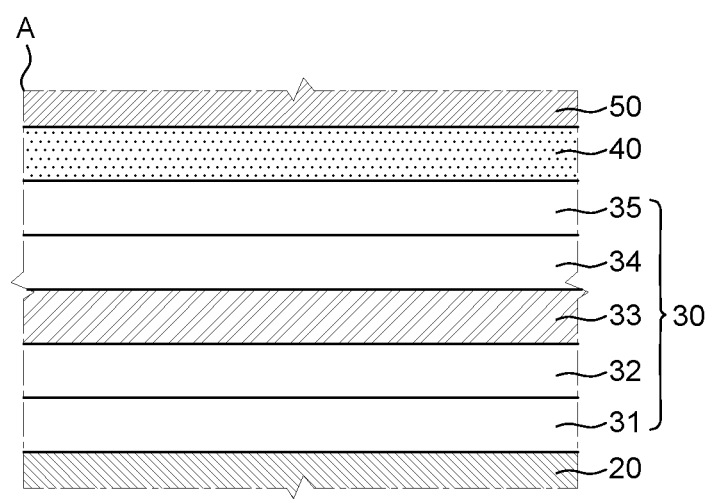
FIG. 2 is an enlarged cross-sectional view of portion A of FIG. 1 according to an exemplary embodiment of the present disclosure.

FIG. 1 is a cross-sectional view of an OLED apparatus 100 according to an exemplary embodiment of the present disclosure. FIG. 2 is an enlarged cross-sectional view of portion A of FIG. 1 according to an exemplary embodiment of the present disclosure.

Referring to FIGS. 1 and 2, an OLED apparatus 100 according to an exemplary embodiment of the present disclosure includes a substrate 10, an organic light-emitting device (ED), a particular layer 50, and an encapsulation element 60.

The substrate 10 may be a flexible film made of transparent glass or polyimide-based material.

The organic light-emitting device ED is disposed on the substrate 10. At least one thin-film transistor and at least one capacitor may be disposed on the substrate 10. The at least one thin-film transistor may be connected to the organic light-emitting device ED to supply a variety of signals thereto.

Referring to FIGS. 1 and 2, the organic light-emitting device ED includes an anode 20, a cathode 40 and a light-emitting unit 30 therebetween. The light-emitting unit 30 refers to all of organic layers or a stack of organic layers disposed between the anode 20 and the cathode 40.

The anode 20 is disposed at every pixel and is spaced apart from one another. The anode 20 is an electrode that supplies or transports holes to the light-emitting unit 30. The anode 20 may be a transparent layer made of transparent conductive oxide (TCO) such as indium tin oxide (ITO), indium zinc oxide (IZO) or the like. If the OLED apparatus 100 is a top-emission OLED apparatus, the anode 20 may further include a reflective layer so that the light emitted from the light-emitting unit 30 is reflected off the anode 20 to exit toward the top side of the OLED more efficiently. For example, the anode 20 may be made up of a stack of two layers, i.e., a transparent layer and a reflective layer, or a stack of three layers, i.e., a transparent layer, a reflective layer, and a transparent layer. The reflective layer may be made of a metal material such as copper (Cu), silver (Ag), palladium (Pd) and the like.

The cathode 40 is disposed on the light-emitting unit 30 and is an electrode that supplies or transports electrons to the light-emitting unit 30. The cathode 40 may be made of a metal material such as silver (Ag), magnesium (Mg) and an alloy of silver and magnesium (Ag:Mg), or a TCO material such as ITO and IZO.

Referring to FIG. 2, the light-emitting unit 30 between the anode 20 and the cathode 40 may have a stack including a hole injecting layer 31, a hole transporting layer 32, an organic light-emitting layer 33, an electron transporting layer 34, and an electron injecting layer 35 stacked on one another in this order. However, such layers may be integrated together as one or more functionalities of one layer may be combined into another layer.

The hole injecting layer 31 may facilitate injection of holes from the anode 20 and may be made of, but is not limited to, MTDATA(4,4',4''-tris(3-methylphenylphenylamino)triphenylamine), CuPc(copper phthalocyanine) or PEDOT/PSS(poly(3,4-ethylenedioxythiophene), polystyrene sulfonate).

The hole transporting layer 32 may facilitate transportation of holes supplied or transported from the anode 20 to the organic light-emitting layer 33 and may be made of, but is not limited to, NPD(N,N'-bis(naphthalene-1-yl)-N,N'-bis(phenyl)-2,2'-dimethylben zidine),
TPD(N,N'-bis-(3-methylphenyl)-N,N'-bis-(phenyl)-benzidine) and spiro-TAD(2,2',7,7'-tetrakis(N,N-diphenylamino)-9,9'-spirofluorene).

The organic light-emitting layer 33 emits light as the holes supplied or transported from the anode 20 combine with the electrons supplied or transported from the cathode 40 and may include at least one host and at least one dopant for emitting light. For example, the organic light-emitting layer 33 may include a dopant for emitting light of at least one of red, green, blue, and yellow-green colors and may be made up of a single layer or a plurality of layers depending how the display device needs to be implemented.

The electron transporting layer 34 may facilitate transportation of electrons supplied or transported from the cathode 40 to the organic light-emitting layer 33 and may be made of, but is not limited to,
PBD(2-(4-biphenyl)-5-(4-tert-butylphenyl)-1,3,4-oxadiazole),
TAZ(3-(4-biphenyl)-4-phenyl-5-tertbutylphenyl-1,2,4-triazole),
Liq(8-hydroxyquinolinolato-lithium),
BAlq(Bis(2-methyl-8-quinolinolate)-4-(phenylphenolato) aluminium), and
TPBi(2,2',2'-(1,3,5-benzinetriyl)-tris(1-phenyl-1-H-benzimidazole).

The electron injecting layer 35 facilitates injection of electrons from the cathode 40.

Referring to FIG. 1, a bank 70 may be disposed on either end of the anode 20 for separating one pixel from another. The bank 70 may be made of an organic material such as, polyimide or photoacryl, but not limited thereto.

An encapsulation element 60 is disposed over the substrate 10 to cover the organic light-emitting device ED. The encapsulation element 60 may protect the organic light-emitting element ED from external foreign matters, impact, permeation of moisture ($H_2O$), oxygen ($O_2$), etc. The encapsulation element 60 may be formed by applying an adhesive layer on the substrate 10 and the front surface of the organic light-emitting device ED or may consist of a filler (or similar material) covering the organic light-emitting device ED and a dam (or similar structure) surrounding the filler. The encapsulation element 60 may include a curable resin and may be made of at least one of epoxy, phenol, amino, unsaturated polyester, rubber, polyimide, silicone, acryl, vinyl, and olefin.

An upper substrate may be further disposed on the encapsulation element 60. The upper substrate 100 may be a flexible film made of glass, a metal material or polyimide-based material depending on the design of the OLED apparatus 100. The substrate 10 may be fixed to the upper substrate by the encapsulation element 60.

As mentioned earlier, a photo-curing process may be carried out during the process of forming the encapsulation element 60 for protecting the organic light-emitting device ED. Specifically, the encapsulation element 60 may be disposed over the substrate 10 to seal the organic light-emitting device ED, and then the encapsulation element 60 may be cured and fixed by performing a photo-curing process with ultraviolet ray or the like. In doing so, the light-emitting unit 30 of the organic light-emitting device ED may be damaged unintentionally by the light irradiated onto the OLED apparatus 100. Further, in some applications where the OLED apparatus 100 is exposed to external environment such as sunlight for long hours, the organic light-emitting device ED may be damaged. If the organic light-emitting device ED is damaged by the light, the driving voltage of the OLED apparatus 100 is increased, such that the lifespan of the OLED apparatus 100 may be shortened, which is a serious problem.

According to an exemplary embodiment of the present disclosure, by forming a particular layer 50 containing a light absorption material on the organic light-emitting device ED, it is possible to suppress the organic light-emitting device ED from being damaged by irradiation during a processing step or by exposure to external environment such as sun light, such as for displays in automotive applications.

Specifically, as shown in FIG. 1, the particular layer 50 is disposed between the organic light-emitting device ED and the encapsulation element 60 and contains a light absorption material so that variation in characteristics of the organic light-emitting device ED by external light is reduced. That is, if ultraviolet light is used in a processing step or external light such as sun light is irradiated onto the OLED apparatus 100, the light absorption material contained in the particular layer 50 absorbs the external light to thereby suppress the light from permeating the organic light-emitting device ED.

As the particular layer 50 contains a light absorption material that absorbs light having a wavelength shorter than a wavelength of the light emitted from the organic light-emitting element ED, the particular layer 50 is configured to absorb light emitted from the organic light-emitting device ED as minimally as possible, whereas the external light incident on the organic light-emitting device ED is absorbed as much as possible.

For example, if light of blue, green, or red color is emitted from the organic light-emitting device ED, the light absorption material may absorb light having a wavelength shorter than the wavelength of the light of blue, green, or red color, e.g., approximately 420 nm or less. In other words, the light absorption material may absorb light having a wavelength of approximately 420 nm or less. Therefore, the effects on the blue, green and red color lights, which are emitted from the organic light-emitting device ED, due to the light absorption material included in the particular layer 50 are minimized such that it is possible to avoid the luminous efficiency of the OLED apparatus 100 from being lowered. In addition, the light absorption material contained in the particular layer 50 absorbs ultraviolet ray used in a processing step or included in external light such as sun light, such that it is possible to improve the problem that the organic light-emitting device ED is damaged by the external light.

For example, the light absorption material may be one among: a hydroxy benzophenone-based compound; a hydroxy phenylbenzotriazole-based compound; a hindered amines-based compound; an organic metal compound containing one metal of iron (Fe), nickel (Ni) and cobalt (Co); a salicylate-based compound; a cinnamate derivative; a resorcinol monobenzoates-based compound; an oxanilides-based compound; a hydroxy benzoates-based compound; an organic or inorganic pigment; carbon black; a coumarin-based compound; a stilbene derivative; a benzoxazolyl-based compound; a benzimidazolyl-based compound; a naphthylimide-based compound; a diaminostilbene sulfonate-based compound; a triazine stilbene-based compound; a phenyl esters-based compound; a benzotriazol-based compound; an S-triazine-based compound; a hydroxyphenyl derivative of a benzoxazole-based compound; a hexamethylphosphoric triamide-based compound; a benzylidenmalonate-based compound; an aliphaticamin or amino alcohol-based derivative; a nitroaromatic compound; a substituted acrylonitrile-based compound; a ferrocene-based compound; a nitrophenylazophenol-based compound; an azo-based compound; a polyene-based polymer derivative; a piperidine-based compound; a piperidinyloxy-based compound; a boron trifluoride-based compound; a thiadiazol-based compound; and a phosphonate-based compound.

The light absorption material may be doped into the particular layer 50 at a concentration of 1 wt % (weight percent) to 50 wt %. If the concentration is less than 1 wt %, the particular layer 50 may fail to sufficiently absorb ultraviolet rays used in a processing step or external light such as sun light, such that the light may permeate into the organic light-emitting device ED to damage the organic light-emitting device ED. On the other hand, if the concentration is greater than 50 wt %, the transmittance of light emitted from the organic light-emitting device ED toward the top side of the OLED apparatus 100, i.e., through the cathode 40 may decrease, such that the luminous efficiency of the OLED apparatus 100 may be lowered.

The particular layer 50 containing the light absorption material may be deposited by vacuum deposition, like the process used in forming the organic light-emitting device ED.

As shown in FIGS. 1 and 2, the particular layer 50 doped with the light absorption material is configured to be disposed between the organic light-emitting device ED and the encapsulation element 60, and, particularly, to be in contact with the cathode 40 of the organic light-emitting device ED. In this manner, it is possible to suppress the cathode 40 from being oxidized by moisture or oxygen. Specifically, the particular layer 50 may be formed via a deposition process like the light-emitting unit 30 and the cathode 40 of the organic light-emitting device ED as described above, and during the process, if the particular layer 50 is formed to be in contact with the cathode 40, a time interval between the process of forming the cathode 40 and the process of forming the particular layer 50 may be very short. In other words, the time period after the cathode 40 is formed until the particular layer 50 is formed may be very short. Accordingly, the particular layer 50 is configured to be in contact with the cathode 40, and thus it is possible to suppress the problem that the cathode 40 of the organic light-emitting device ED is exposed to the atmosphere during the time interval until the organic light-emitting device ED on the substrate is sealed by the encapsulation element 60 and is oxidized by moisture ($H_2O$) or oxygen ($O_2$). More preferably, as shown in FIG. 1, the particular layer 50 may cover the cathode 40 completely, thereby protecting the cathode 40 from moisture ($H_2O$) or oxygen ($O_2$) more efficiently.

As described above according to an exemplary embodiment of the present disclosure, the OLED apparatus 100 includes the particular layer 50 between the organic light-emitting device ED and the encapsulation element 60, which contains the light absorption material that absorbs light having a wavelength shorter than the wavelength of the light emitted from the organic light-emitting device ED, thereby suppressing oxidation of the cathode 40 by moisture or oxygen or suppressing damage to the organic light-emitting device ED by ultraviolet rays used in a processing step or included in external light such as sun light.

Figure 3:
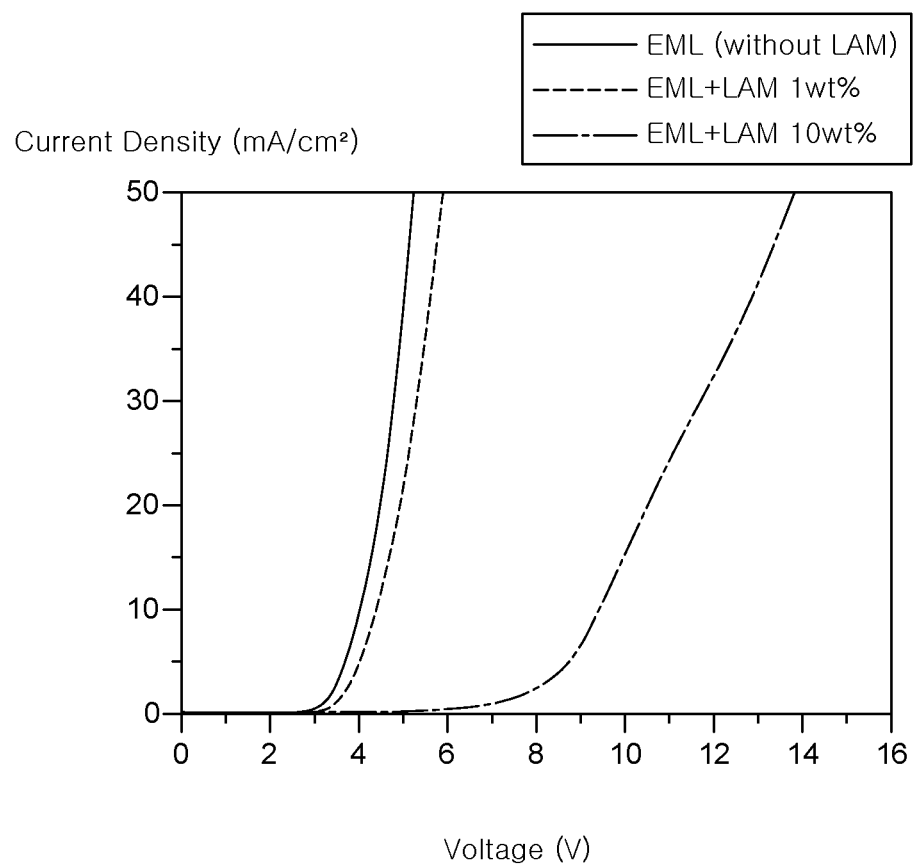
FIG. 3 is a graph showing driving voltages of an OLED apparatus with a light absorption material doped into an organic light-emitting layer inside an organic light-emitting device.

FIG. 3 is a graph showing driving voltages of an OLED apparatus with a light absorption material doped into an organic light-emitting layer inside an organic light-emitting device. Specifically, the OLED apparatus 100 according to the exemplary embodiment of the present disclosure described above with reference to FIGS. 1 and 2 has the structure in which the particular layer 50 containing the light absorption material is disposed between the organic light-emitting device ED and the encapsulation element 60, i.e., outside the organic light-emitting device ED. In contrast, FIG. 3 shows driving voltages of an OLED apparatus having a structure in which light absorption material is doped in an organic light-emitting device, i.e., in an organic light-emitting layer of the organic light-emitting device.

Referring to FIG. 3, when there is no light absorption material (LAM) in the organic light-emitting layer EML of the organic light-emitting device, the driving voltage is approximately 4 V at the current density of 10 mA/$cm^2$.

In addition, when light absorption material (LAM) is doped into the organic light-emitting layer EML of the organic light-emitting device at the concentration of 1 wt %, the driving voltage is approximately 4.5 V at the current density of 10 mA/cm². That is, the driving voltage has been increased by approximately 0.5 V compared to the organic light-emitting device with no light absorption material in the organic light-emitting layer EML.

In addition, when light absorption material (LAM) is doped into the organic light-emitting layer EML of the organic light-emitting device at the concentration of 10 wt %, the driving voltage is approximately 8.8V at the current density of 10 mA/cm². That is, the driving voltage has been increased by approximately 4.8V and 4.3 V compared to the organic light-emitting device with no light absorption material in the organic light-emitting layer EML and the organic light-emitting device with the light absorption material doped into the organic light-emitting layer EML at the concentration of 1 wt %, respectively.

As mentioned earlier, the organic light-emitting device emits light as holes and electrons supplied or transported from the two electrodes, respectively, are transported to the organic light-emitting layer via a variety of organic layers in the light-emitting unit and the holes and electrons combine in the organic light-emitting layer. If the light absorption material (LAM) is doped into some organic layers of the organic light-emitting device, the light absorption material (LAM) disrupts movement of the holes and electrons, i.e., electric charges, thereby deteriorating characteristics of the organic light-emitting device. That is, as can be seen from FIG. 3, as the amount of light absorption material (LAM) doped into the organic light-emitting layer EML of the organic light-emitting device increases, the mobility of the electric charges in the organic light-emitting device becomes lower by the light absorption material (LAM), such that the driving voltage of the organic light-emitting devices increases. Such increase in the driving voltage of the organic light-emitting device may shorten the lifespan of the OLED apparatus.

In view of this, according to an exemplary embodiment of the present disclosure, the light absorption material is contained in a particular layer 50 outside the organic light-emitting device ED, such that it is possible to avoid the problem that the mobility of the charges of the organic light-emitting device ED becomes lowered, compared to the structure in which the light absorption material is doped into some organic layers inside the organic light-emitting device ED. As a result, it is possible to suppress an increase in the driving voltage of the organic light-emitting device ED by the light absorption material while reducing damage to the organic light-emitting device ED by the external light.

Figure 4:
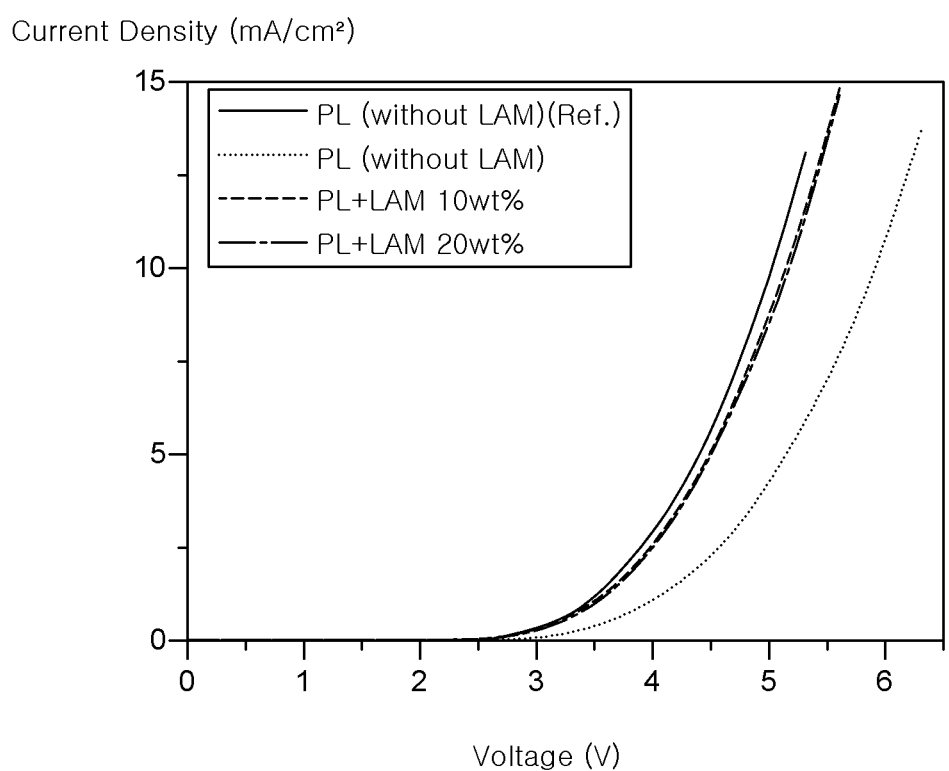
FIG. 4 is a graph showing driving voltages of an OLED apparatus measured by varying the amount of the light absorption material doped into a particular layer with/ without light irradiation according to an exemplary embodiment of the present disclosure.
Figure 5:
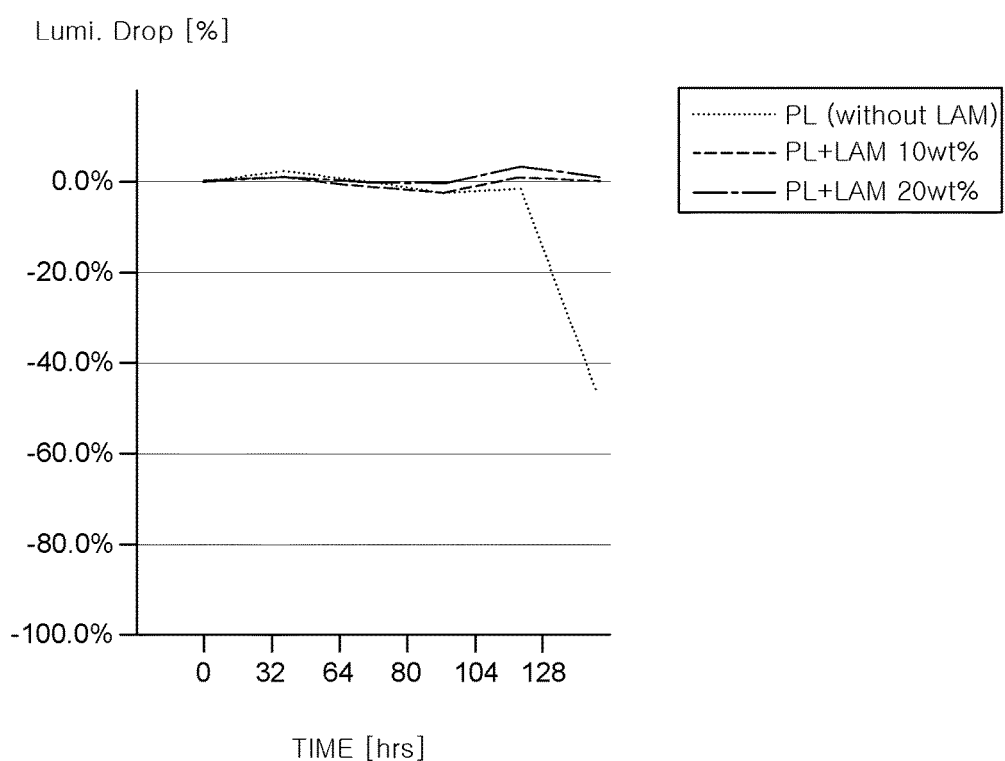
FIG. 5 is a graph for illustrating the lifespan of an OLED apparatus by varying the amount of the light absorption material doped into a particular layer with/without light irradiation according to an exemplary embodiment of the present disclosure.

FIG. 4 is a graph showing driving voltages of an OLED apparatus 100 measured by varying the amount of the light absorption material doped into a particular layer 50 with/without light irradiation according to an exemplary embodiment of the present disclosure. FIG. 5 is a graph for illustrating the lifespan of an OLED apparatus 100 by varying the amount of the light absorption material doped into a particular layer with/without light irradiation according to an exemplary embodiment of the present disclosure. Specifically, the particular layer PL of FIGS. 4 and 5 is one that is disposed between the organic light-emitting device ED and the encapsulation element 60 and is configured to be in contact with the cathode 40 of the organic light-emitting device, which is described above with reference to FIGS. 1 and 2.

Referring to FIG. 4, when there is no light absorption material (LAM) in the particular layer PL of the organic light-emitting device, the driving voltage is approximately 5 V at the current density of 10 mA/cm² before irradiation (indicated by Ref.). When light of the wavelength of 420 nm that has the energy of 2.4 W/m² was irradiated onto the organic light-emitting device with no light absorption material (LAM) in the particular layer PL for approximately 100 hours, the driving voltage was increased to approximately 5.9 V at the current density of 10 mA/cm². That is, the driving voltage was increased by 0.9 V compared to that before the irradiation. In addition, as shown in FIG. 5, in the organic light-emitting device with no light absorption material (LAM) in the particular layer PL, the luminance was drastically dropped after approximately 104 hours. Further, at approximately 128 hours, the luminance was dropped to 40% or less of the initial luminance. That is, in the organic light-emitting device with no light absorption material (LAM) in the particular layer PL, the organic light-emitting device was damaged by the light such that the driving voltage was increased. As a result, it can be seen that the luminance of the OLED apparatus was dropped and thus the lifespan was shortened.

In contrast, when light of the wavelength of 420 nm that has the energy of 2.4 W/m² was irradiated onto the organic light-emitting device with the light absorption material (LAM) doped into the particular layer PL at the concentration of 10 wt % for approximately 100 hours, the driving voltage was approximately 5.2V at the current density of 10 mA/cm², as shown in FIG. 4. That is, the driving voltage was increased by only 0.2V compared to that before the irradiation. Similarly, when light of the wavelength of 420 nm that has the energy of 2.4 W/m² was irradiated onto the organic light-emitting device with the light absorption material (LAM) doped into the particular layer PL at the concentration of 20 wt % for approximately 100 hours, the driving voltage was approximately 5.2V at the current density of 10 mA/cm². That is, the driving voltage was increased by only 0.2V compared to that before the irradiation. In addition, as shown in FIG. 5, in the organic light-emitting device with the light absorption material (LAM) doped into the particular layer PL at the concentration of 10 wt % or 20 wt %, the luminance was rarely dropped over time, unlike the organic light-emitting device with no light absorption material (LAM) in the particular layer PL. That is, in the organic light-emitting device with the light absorption material (LAM) doped into the particular layer PL at the concentration of 10 wt % or 20 wt %, the light absorption material (LAM) in the particular layer PL absorbed external light, such that light rarely reached the organic light-emitting device. As a result, it can be seen that variation in the driving voltage of the organic light-emitting device was suppressed. In addition, it can be seen that that the luminance and the lifespan of the OLED apparatus have been improved compared to the organic light-emitting device with no light absorption material (LAM) in the particular layer PL.

As described above, external light may affect the characteristics of the organic light-emitting device, e.g., the driving voltage. However, according to an exemplary embodiment of the present disclosure, by doping the light absorption material (LAM) into the particular layer PL disposed between the organic light-emitting device and the encapsulation element, the external light can be absorbed by the light absorption material (LAM) to thereby reduce the characteristics degradation of the organic light-emitting device. That is, compared to the organic light-emitting device having the structure in which the light absorption material (LAM) is doped into some organic layers inside the organic light-emitting device, the organic light-emitting device having the structure according to exemplary embodiments of the present disclosure can protect the organic light-emitting device from external light without disrupting movement of the electric charges in the organic light-emitting device. As a result, it is possible to avoid problems such as a decrease in the driving voltage, a drop in the luminance, or shortening of the lifespan.

The exemplary embodiments of the present disclosure can also be described as follows:

According to an aspect of the present disclosure, there is provided an organic light-emitting display (OLED) apparatus including an organic light-emitting device including an anode, an organic light-emitting layer, and a cathode. The OLED apparatus also includes an encapsulation element covering the organic light-emitting device, and a particular layer disposed between the organic light-emitting device and the encapsulation element. The particular layer is doped with a light absorption material that absorbs light having a wavelength shorter than a wavelength of light emitted from the organic light-emitting device so that variation in characteristics of the organic light-emitting device by external light is reduced.

The light absorption material may absorb light having a wavelength equal to or less than 420 nm.

The light absorption material may be doped into the particular layer 50 at a concentration of 1 wt % to 50 wt %.

The particular layer may be in contact with the cathode so as to suppress the cathode from being damaged by moisture or oxygen.

The particular layer may completely cover the cathode.

The light absorption material may be one of: a hydroxy benzophenone-based compound; a hydroxy phenylbenzotriazole-based compound; a hindered amines-based compound; an organic metal compound containing one metal of iron (Fe), nickel (Ni) and cobalt (Co); a salicylate-based compound; a cinnamate derivative; a resorcinol monobenzoates-based compound; an oxanilides-based compound; a hydroxy benzoates-based compound; an organic or inorganic pigment; carbon black; a coumarin-based compound; a stilbene derivative; a benzoxazolyl-based compound; a benzimidazolyl-based compound; a naphthylimide-based compound; a diaminostilbene sulfonate-based compound; a triazine stilbene-based compound; a phenyl esters-based compound; a benzotriazol-based compound; an S-triazine-based compound; a hydroxyphenyl derivative of a benzoxazole-based compound; a hexamethylphosphoric triamide-based compound; a benzylidenmalonate-based compound; an aliphaticamin or amino alcohol-based derivative; a nitroaromatic compound; a substituted acrylonitrile-based compound; a ferrocene-based compound; a nitrophenylazophenol-based compound; an azo-based compound; a polyene-based polymer derivative; a piperidine-based compound; a piperidinyloxy-based compound; a boron trifluoride-based compound; a thiadiazol-based compound; and a phosphonate-based compound.

According to another aspect of the present disclosure, an organic light-emitting display (OLED) apparatus includes an organic light-emitting device disposed on a substrate and including an anode, an organic light-emitting layer, and a cathode. The OLED apparatus also includes a particular layer disposed on the organic light-emitting device to completely cover the cathode, wherein the particular layer contains a light absorption material.

The particular layer may be disposed to be in contact with the cathode, and the particular layer may be configured to suppress the cathode from being oxidized by moisture or oxygen and suppress the organic light-emitting layer from being damaged by external light.

The light absorption material may absorb light having a wavelength shorter than a wavelength of light emitted from the organic light-emitting device.

The light absorption material may absorb light having a wavelength equal to or less than 420 nm.

The light absorption material may be doped into the particular layer 50 at a concentration of 1 wt % to 50 wt %.

The light absorption material may be one of: a hydroxy benzophenone-based compound; a hydroxy phenylbenzotriazole-based compound; a hindered amines-based compound; an organic metal compound containing one metal of iron (Fe), nickel (Ni) and cobalt (Co); a salicylate-based compound; a cinnamate derivative; a resorcinol monobenzoates-based compound; an oxanilides-based compound; a hydroxy benzoates-based compound; an organic or inorganic pigment; carbon black; a coumarin-based compound; a stilbene derivative; a benzoxazolyl-based compound; a benzimidazolyl-based compound; a naphthylimide-based compound; a diaminostilbene sulfonate-based compound; a triazine stilbene-based compound; a phenyl esters-based compound; a benzotriazol-based compound; an S-triazine-based compound; a hydroxyphenyl derivative of a benzoxazole-based compound; a hexamethylphosphoric triamide-based compound; a benzylidenmalonate-based compound; an aliphaticamin or amino alcohol-based derivative; a nitroaromatic compound; a substituted acrylonitrile-based compound; a ferrocene-based compound; a nitrophenylazophenol-based compound; an azo-based compound; a polyene-based polymer derivative; a piperidine-based compound; a piperidinyloxy-based compound; a boron trifluoride-based compound; a thiadiazol-based compound; and a phosphonate-based compound.

Thus far, exemplary embodiments of the present disclosure have been described in detail with reference to the accompanying drawings. However, the present disclosure is not limited to the exemplary embodiments, and modifications and variations can be made thereto without departing from the technical idea of the present disclosure. Accordingly, the exemplary embodiments described herein are merely illustrative and are not intended to limit the scope of the present disclosure. The technical idea of the present disclosure is not limited by the exemplary embodiments. Therefore, it should be understood that the above-described embodiments are not limiting but illustrative in all aspects. The scope of protection sought by the present disclosure is defined solely by the appended claims and all equivalents thereof are construed to be within the true scope of the present disclosure.

What is claimed is:

1. An organic light-emitting display (OLED) apparatus comprising:
    an organic light-emitting device comprising an anode, an organic light-emitting layer, and a cathode;
    an encapsulation element covering the organic light-emitting device; and
    a particular layer disposed between the organic light-emitting device and the encapsulation element,
    wherein the particular layer comprises a light absorption material that absorbs light having a wavelength shorter than a wavelength of light emitted from the organic light-emitting device so that variation in characteristics of the organic light-emitting device by external light is reduced and
    wherein the particular layer is in contact with the cathode so as to suppress the cathode from being damaged by moisture or oxygen.

2. The OLED apparatus of claim 1, wherein the light absorption material absorbs light having a wavelength equal to or less than 420 nm.

3. The OLED apparatus of claim 1, wherein the particular layer comprises the light absorption material at a concentration of 1 wt % to 50 wt %.

4. The OLED apparatus of claim 1, wherein the particular layer covers the cathode.

5. The OLED apparatus of claim 1, wherein the light absorption material is at least one among: a hydroxy benzophenone-based compound; a hydroxy phenylbenzotriazole-based compound; a hindered amines-based compound; an organic metal compound containing one metal of iron (Fe), nickel (Ni) and cobalt (Co); a salicylate-based compound; a cinnamate derivative; a resorcinol monobenzoates-based compound; an oxanilides-based compound; a hydroxy benzoates-based compound; an organic or inorganic pigment; carbon black; a coumarin-based compound; a stilbene derivative; a benzoxazolyl-based compound; a benzimidazolyl-based compound; a naphthylimide-based compound; a diaminostilbene sulfonate-based compound; a triazine stilbene-based compound; a phenyl esters-based compound; a benzotriazol-based compound; an S-triazine-based compound; a hydroxyphenyl derivative of a benzoxazole-based compound; a hexamethylphosphoric triamide-based compound; a benzylidenmalonate-based compound; an aliphaticamin or amino alcohol-based derivative; a nitroaromatic compound; a substituted acrylonitrile-based compound; a ferrocene-based compound; a nitrophenylazophenol-based compound; an azo-based compound; a polyene-based polymer derivative; a piperidine-based compound; a piperidinyloxy-based compound; a boron trifluoride-based compound; a thiadiazol-based compound; and a phosphonate-based compound.

6. An organic light-emitting display (OLED) apparatus comprising:
    an organic light-emitting device disposed on a substrate, the organic light-emitting device comprising an anode, an organic light-emitting layer, and a cathode; and
    a particular layer disposed on the organic light-emitting device to cover the cathode, wherein the particular layer contains a light absorption material and
    wherein the particular layer is disposed to be in contact with the cathode, and the particular layer is configured to suppress the cathode from being oxidized by moisture or oxygen and suppress the organic light-emitting layer from being damaged by external light.

7. The OLED apparatus of claim 6, wherein the light absorption material is at least one among: a hydroxy benzophenone-based compound; a hydroxy phenylbenzotriazole-based compound; a hindered amines-based compound; an organic metal compound containing one metal of iron (Fe), nickel (Ni) and cobalt (Co); a salicylate-based compound; a cinnamate derivative; a resorcinol monobenzoates-based compound; an oxanilides-based compound; a hydroxy benzoates-based compound; an organic or inorganic pigment; carbon black; a coumarin-based compound; a stilbene derivative; a benzoxazolyl-based compound; a benzimidazolyl-based compound; a naphthylimide-based compound; a diaminostilbene sulfonate-based compound; a triazine stilbene-based compound; a phenyl esters-based compound; a benzotriazol-based compound; an S-triazine-based compound; a hydroxyphenyl derivative of a benzoxazole-based compound; a hexamethylphosphoric triamide-based compound; a benzylidenmalonate-based compound; an aliphaticamin or amino alcohol-based derivative; a nitroaromatic compound; a substituted acrylonitrile-based compound; a ferrocene-based compound; a nitrophenylazophenol-based compound; an azo-based compound; a polyene-based polymer derivative; a piperidine-based compound; a piperidinyloxy-based compound; a boron trifluoride-based compound; a thiadiazol-based compound; and a phosphonate-based compound.

8. The OLED apparatus of claim 6, wherein the light absorption material absorbs light having a wavelength shorter than a wavelength of light emitted from the organic light-emitting device.

9. The OLED apparatus of claim 8, wherein the light absorption material absorbs light having a wavelength equal to or less than 420 nm.

10. The OLED apparatus of claim 6, wherein the particular layer comprises the light absorption material at a concentration of 1 wt % to 50 wt %.

11. An organic light-emitting display (OLED) apparatus comprising:
    an organic light-emitting device disposed on a substrate, the organic light-emitting device comprising an anode, an organic light-emitting layer, and a cathode; and
    a particular layer disposed on the organic light-emitting device to cover the cathode, wherein the particular layer contains a light absorption material, wherein the light absorption material is at least one among: a hydroxy benzophenone-based compound; a hydroxy phenylbenzotriazole-based compound; a hindered amines-based compound; a salicylate-based compound; a cinnamate derivative; a resorcinol monobenzoates-based compound; an oxanilides-based compound; a hydroxy benzoates-based compound; an organic or inorganic pigment; carbon black; a coumarin-based compound; a stilbene derivative; a benzoxazolyl-based compound; a benzimidazolyl-based compound; a naphthylimide-based compound; a diaminostilbene sulfonate-based compound; a triazine stilbene-based compound; a phenyl esters-based compound; a benzotriazol-based compound; an S-triazine-based compound; a hydroxyphenyl derivative of a benzoxazole-based compound; a hexamethylphosphoric triamide-based compound; a benzylidenmalonate-based compound; an aliphaticamin or amino alcohol-based derivative; a nitroaromatic compound; a substituted acrylonitrile-based compound; a ferrocene-based compound; a nitrophenylazophenol-based compound; an azo-based compound; a polyene-based polymer derivative; a piperidine-based compound; a piperidinyloxy-based compound; a boron trifluoride-based compound; a thiadiazol-based compound; and a phosphonate-based compound.

* * * * *